US006763113B2

(12) United States Patent
Maejima

(10) Patent No.: US 6,763,113 B2
(45) Date of Patent: Jul. 13, 2004

(54) SPEAKER DRIVING CIRCUIT

(75) Inventor: Yoshimichi Maejima, Kanagawa (JP)

(73) Assignee: Sony Corporation, Tokyo (JP)

(*) Notice: Subject to any disclaimer, the term of this patent is extended or adjusted under 35 U.S.C. 154(b) by 582 days.

(21) Appl. No.: 09/802,192

(22) Filed: Mar. 8, 2001

(65) Prior Publication Data

US 2001/0038700 A1 Nov. 8, 2001

(30) Foreign Application Priority Data

Mar. 13, 2000 (JP) .................................... P2000-068933

(51) Int. Cl.[7] ................................................ H03G 3/00

(52) U.S. Cl. ...................................... 381/109; 381/103

(58) Field of Search ........................... 381/109, 98, 55, 381/104, 107, 108, 103

(56) References Cited

U.S. PATENT DOCUMENTS 4,113,983 A * 9/1978 Steel ........................... 381/98
4,118,604 A * 10/1978 Yanick ....................... 381/320
6,061,455 A * 5/2000 Hadley et al. ................ 381/57

* cited by examiner

*Primary Examiner*—Minsun Oh Harvey
*Assistant Examiner*—Brian Tyrone Pendleton
(74) *Attorney, Agent, or Firm*—Jay H. Maioli

(57) ABSTRACT

To avoid adverse effects on sound quality when the level of an audio signal is raised, a speaker driving circuit having an ultralow range emphasizing circuit for emphasizing an ultralow range, a high-pass filter, and a switching circuit for removing the high-pass filter from an audio signal path when an audio signal to be supplied to a speaker is below a medium level and for inserting the high-pass filter in the audio signal path when the audio signal to be supplied to the speaker is above the medium level is provided.

2 Claims, 5 Drawing Sheets

SPEAKER DRIVING CIRCUIT

BACKGROUND OF THE INVENTION

1. Field of the Invention

The present invention relates to a speaker driving circuit suitably used for driving a relatively small speaker such as a speaker incorporated in a television receiver.

2. Description of the Related Art

In a television receiver, for example, a relatively small speaker is used because the space is limited so that bass of an ultralow region cannot be reproduced well generally. In addition, human auditory characteristics vary according to levels of sound, and have a tendency as follows. As a sound level becomes low, sensitivity for an ultralow range is also lowered. Accordingly, when a sound level is low, there is a problem that it is difficult to hear ultralow bass.

In order to solve the above problem that it is hard to hear ultralow bass with its sound level being low, there has hitherto been known a method of using a so-called loudness control circuit, which makes frequency characteristics of a speaker driving circuit variable corresponding to a reproducing level of a sound level. By the loudness control circuit, frequency characteristics of a speaker driving circuit is changed to be relatively flat when a reproducing level is high, and a low range of frequency characteristics of the speaker driving circuit is made to boost when a reproducing level is low, When the reproducing level is low, a high range is also emphasized by the loudness control circuit. FIG. 5 is a circuit diagram showing an example of a loudness control circuit.

In explaining according to FIG. 5, reference numeral 1 in FIG. 5 denotes an audio signal input terminal for receiving an audio signal, this audio signal input terminal 1 is connected to a one end of a coupling capacitor 2, while the other end of this coupling capacitor 2 is grounded by way of a series circuit of capacitors 3, 4 and a resistor 5, and a connection mid point of the coupling capacitor 2 and capacitor 3 is grounded through a variable resistor 6, and a grounding mid point of the capacitors 3 and 4 is connected to an intermediate point of a resistor element 6*a* of this variable resistor 6.

An audio signal obtained at a movable element 6*b* of this variable resistor 6 is supplied into a power amplifier 8 through a coupling capacitor 7, and an audio signal obtained at the output side of this power amplifier 8 is supplied into a voice coil of a speaker 9, and the diaphragm of this speaker 9 is oscillated to emit a sound.

As shown in FIG. 6, frequency characteristics of an audio signal supplied from the power amplifier 8 to the speaker 9 is flat from the ultralow range to the high range when the reproducing level is high. When the reproducing level is low, the ultralow range and the high range is boosted. Therefore, irrespective of a high or low level of reproduction, ultralow range sound can be heard. Furthermore, the frequency characteristics extend to the ultralow range so that bass of high quality can be obtained without phase loss of the signal.

However, with a relatively small speaker such as a speaker incorporated in a television receiver, when the level of audio signal is raised and the speaker 9 is driven by the ultralow range signal of high level, the diaphragm of the speaker 9 itself does oscillates, but cannot drive the air sufficiently. So, adverse effects are caused on the sound quality.

SUMMARY OF THE INVENTION

The present invention is devised in the light of the above problems, and it is an object thereof to avoid adverse effects on the sound quality even if the level of the audio signal is raised.

The present invention presents a speaker driving circuit comprising a volume adjusting means for adjusting an output level of an audio signal supplied to a speaker and an ultralow bass emphasizing circuit frequency characteristics of which is variable corresponding to an adjusted state of the volume adjusting means, which further comprises level detecting means for detecting an adjusted state of the volume adjusting means and ultralow bass component reducing means for, when it is detected by the level detecting means that the volume adjusting means is adjusted to make an output level of the audio signal become higher than a specified level, reducing an ultralow bass component of the audio signal.

According to the present invention, as far as the audio signal is below the medium level, the speaker is driven by a signal extended in the frequency characteristic to the ultralow range, the bass of high quality is obtained without phase loss, but when the audio signal is above the medium level, since the ultralow range is cut off by the high-pass filter, clip or the like does not occur, and the diaphragm of the speaker does not oscillate in the ultraslow range, so that there is no adverse effect on the sound quality.

DESCRIPTION OF THE PREFERRED EMBODIMENTS

Figures 1, 5:
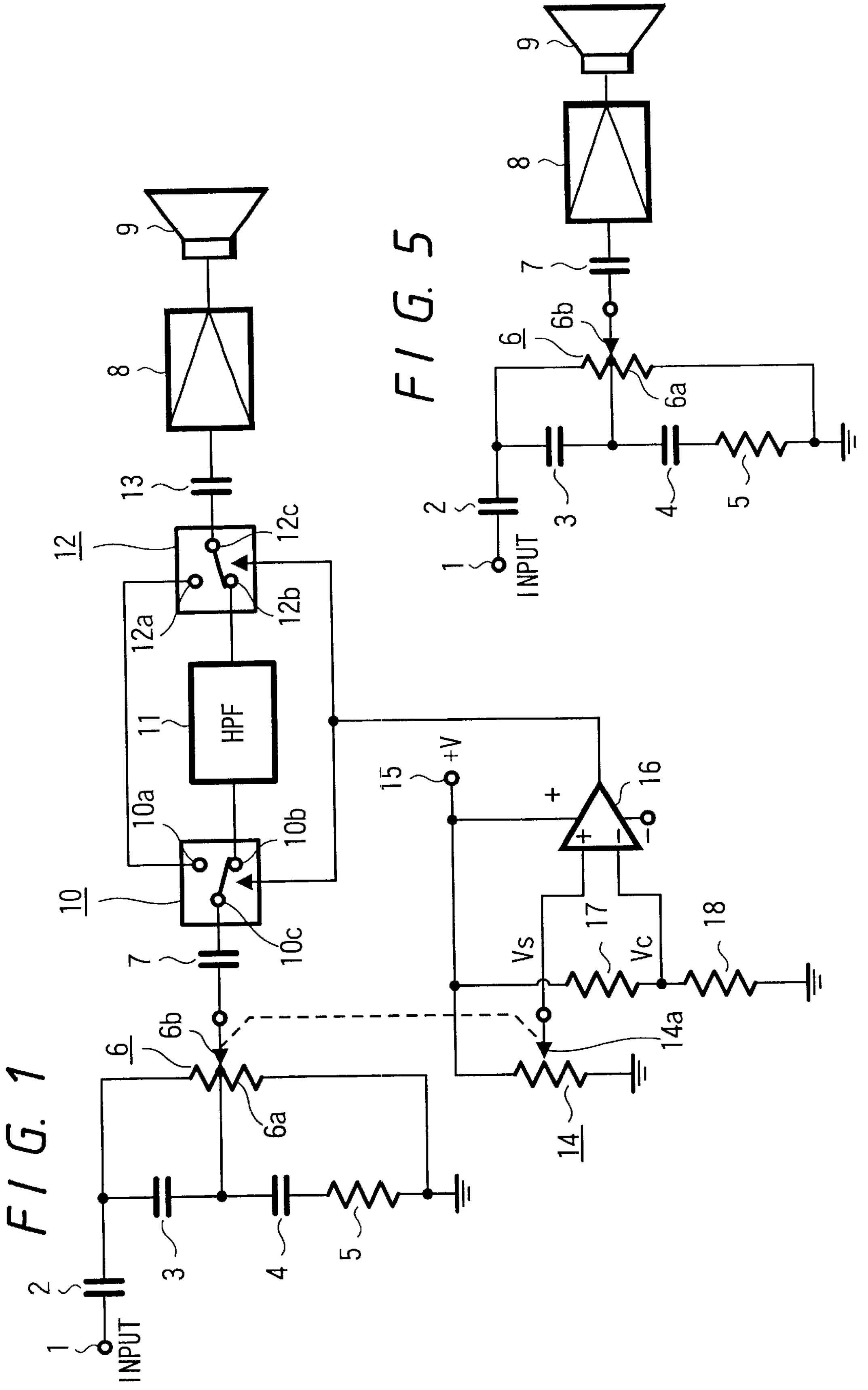
FIG. 1 is a block diagram showing an example of an embodiment of a speaker driving circuit of the invention.
FIG. 5 is a block diagram showing a prior art of a speaker driving circuit.
Figure 2:
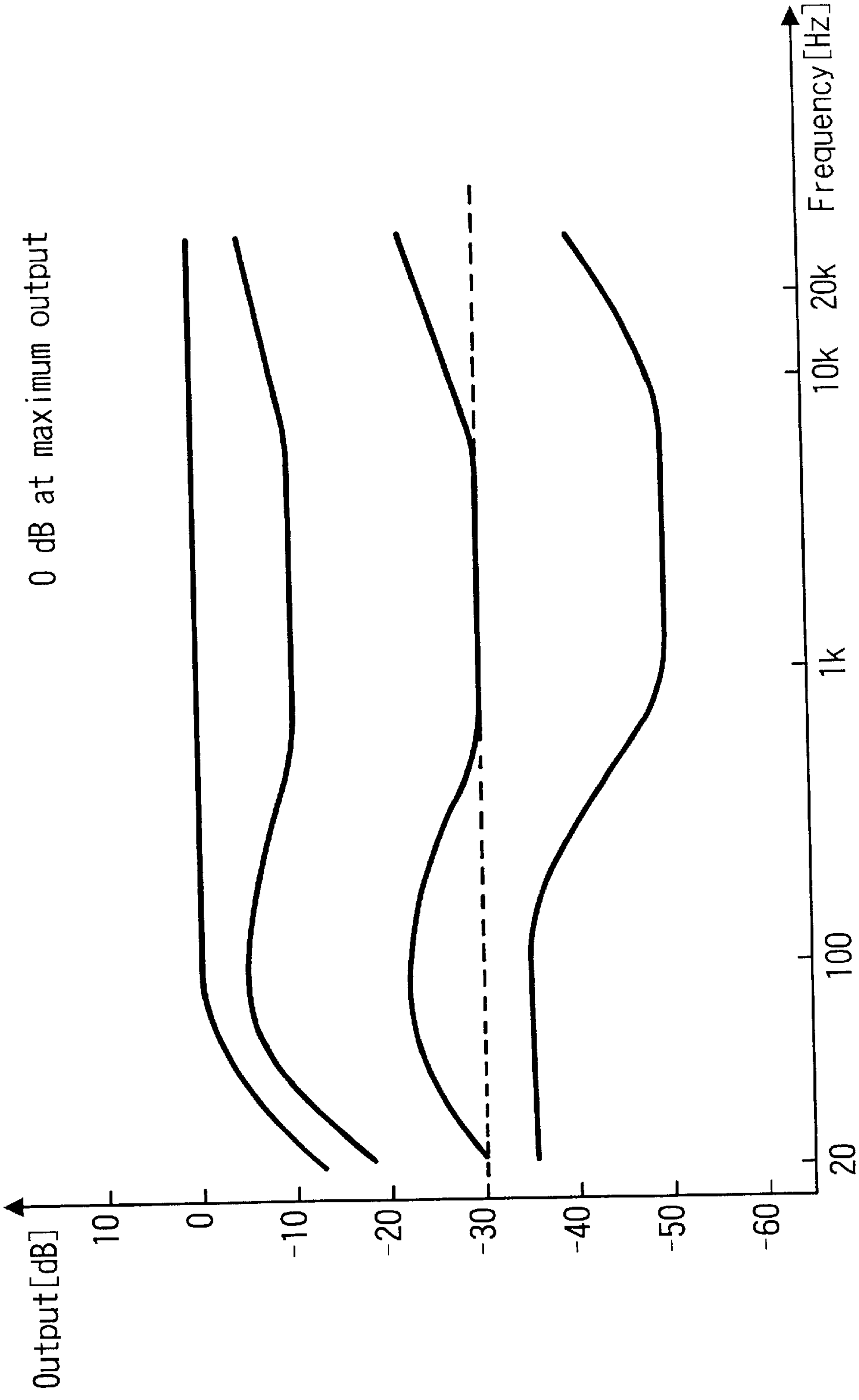
FIG. 2 is a diagram for explaining FIG. 1.

An embodiment of a speaker driving circuit of the invention is explained by referring to FIG. 1 and FIG. 2. In FIG. 1, the parts corresponding to FIG. 5 are identified with the same reference numerals.

In FIG. 1, reference numeral 1 denotes an audio signal input terminal for receiving an audio signal, this audio signal input terminal 1 is connected to a one end of a coupling capacitor 2, while the other end of this coupling capacitor 2 is grounded by way of a series circuit of capacitors 3, 4 and a resistor 5, and a connection mid point of the coupling capacitor 2 and capacitor 3 is grounded through a variable resistor 6, and a grounding mid point of the capacitors 3 and 4 is connected to an intermediate point of a resistor element 6*a* of this variable resistor 6. The capacitor 3, capacitor 4, resistor 5, and variable resistor 6 comprise the loudness control circuit.

In this example, a movable element 6*b* of this variable resistor 6 is connected to a movable contact point 10*c* of a changeover switch 10 through the coupling capacitor 7, and one fixed contact point 10*a* of this changeover switch 10 is connected to one fixed contact point 10*a* of a changeover switch 12, and other fixed contact point 10*b* of this changeover switch 10 is connected to another fixed contact point 12*b* of the changeover switch 12 through a high-pass filter 11 for cutting off the ultralow range.

An audio signal obtained at a movable contact point 12*c* of this changeover switch 12 is supplied to a power amplifier 8 through a coupling capacitor 13, and an audio signal obtained at the output side of this power amplifier 8 is supplied to a voice coil of a speaker 9, thereby oscillating the diaphragm of the speaker 9 to emit a sound.

In this embodiment, a level detecting variable resistor 14 is provided. That is, a power source terminal 15 for obtaining a positive DC voltage of +V is grounded through this level detecting variable resistor 14, and the movable element 14*a* of this level detecting variable resistor 14 is interlocked with the movable element 6*b* of the variable resistor 6 for audio level adjustment.

In this case, a detection voltage level Vs depending on the position of the movable element 6*b* of the variable resistor 6 for audio level adjustment, i.e., an audio volume adjusted state, is obtained at the movable terminal 14*a* of the level detecting variable resistor 14.

This detection voltage level Vs obtained at the movable element 14*a* of the level detecting variable resistor 14 is applied to a non-inverting input terminal + of an operational amplifier 16 for composing a comparator.

The power source terminal 15 is grounded through a series circuit of resistors 17 and 18 for division, so that the voltage obtained at the connection mid point of the resistors 17 and 18 may be voltage Vc equal to the detection voltage level Vs obtained at the movable element 14*a* of the level detecting variable resistor 14 when the level of the audio signal obtained at the movable element 6*b* of the variable resistor 6 may be a medium level, for example, the level applied to the speaker 9 is −30 dB.

The voltage Vc obtained at the connection mid point of the resistors 17 and 18 is applied to an inverting input terminal− of the operation amplifier 16. Therefore, on the output side of the operational amplifier 16, when the detection voltage level Vs obtained at the movable element 14*a* of the level detecting variable resistor 14 ranges from 0 V to voltage Vc, that is, the level of audio signal supplied to the voice coil of the speaker 9 is below the medium level, for example, below −30 dB, it is low level "0", and when the detection voltage level Vs obtained at the movable element 14*a* is above voltage Vc, that is, when the level of audio signal supplied to the voice coil of the speaker 9 is above the medium level, for example, above −30 dB, it is high level "1".

In the embodiment, by the output of the operational amplifier 16, the movable contact points 10*c* and 12*c* of the changeover switches 10 and 12 are controlled. That is, when the output side of the operational amplifier 16 is low level "0", the movable contact points 10*c* and 12*c* of the changeover switches 10 and 12 are connected to the fixed contact points 10*a* and 12*a* of the changeover switches 10 and 12, and the high-pass filter 11 is inserted into the audio signal path.

On the other hand, when the output side of the operational amplifier 16 is high level "1", the movable contact points 10*c* and 12*c* of the changeover switches 10 and 12 are connected to the other fixed contact points 10*b* and 12*b*, and the high-pass filter 11 is inserted the audio signal path.

Therefore, the frequency characteristic of the audio signal supplied to the voice coil of the speaker 9 is as shown in FIG. 2, and when the audio signal level is below the medium level, for example, below −30 dB (indicated by a broken line), the characteristic is emphasized in the ultralow range, and at this time since the voice coil of the speaker 9 is driven by an audio signal extended in the frequency characteristic to the ultralow range, the bass of high quality is obtained without phase loss.

When the level of the audio signal supplied in the voice coil of the speaker 9 is above the medium level, for example, above −30 dB, the frequency characteristic of the audio signal is as shown in FIG. 2, that is, the ultralow range is cut off by the high-pass filter 11, and hence clip or the like does not occur, and moreover since the diaphragm of the speaker 9 does not oscillate in the ultralow range, there is no adverse effect on the sound quality.

As explained above, according to the embodiment, when the audio signal is below the medium level, for example, below −30 dB (containing an ordinary audio level in television receiver), the ultralow range is emphasized, and the voice coil of the speaker 9 is driven by an audio signal extended in the frequency characteristic to ultralow range, and therefore the bass of high quality is obtained without phase loss, and when the audio signal is above the medium level, for example, above −30 dB, the ultralow range is cut off by the high-pass filter 11, and hence clip or the like does not occur, and moreover since the diaphragm of the speaker 9 is not oscillated in the ultralow range, there is no adverse effect on the sound quality.

Figure 3:
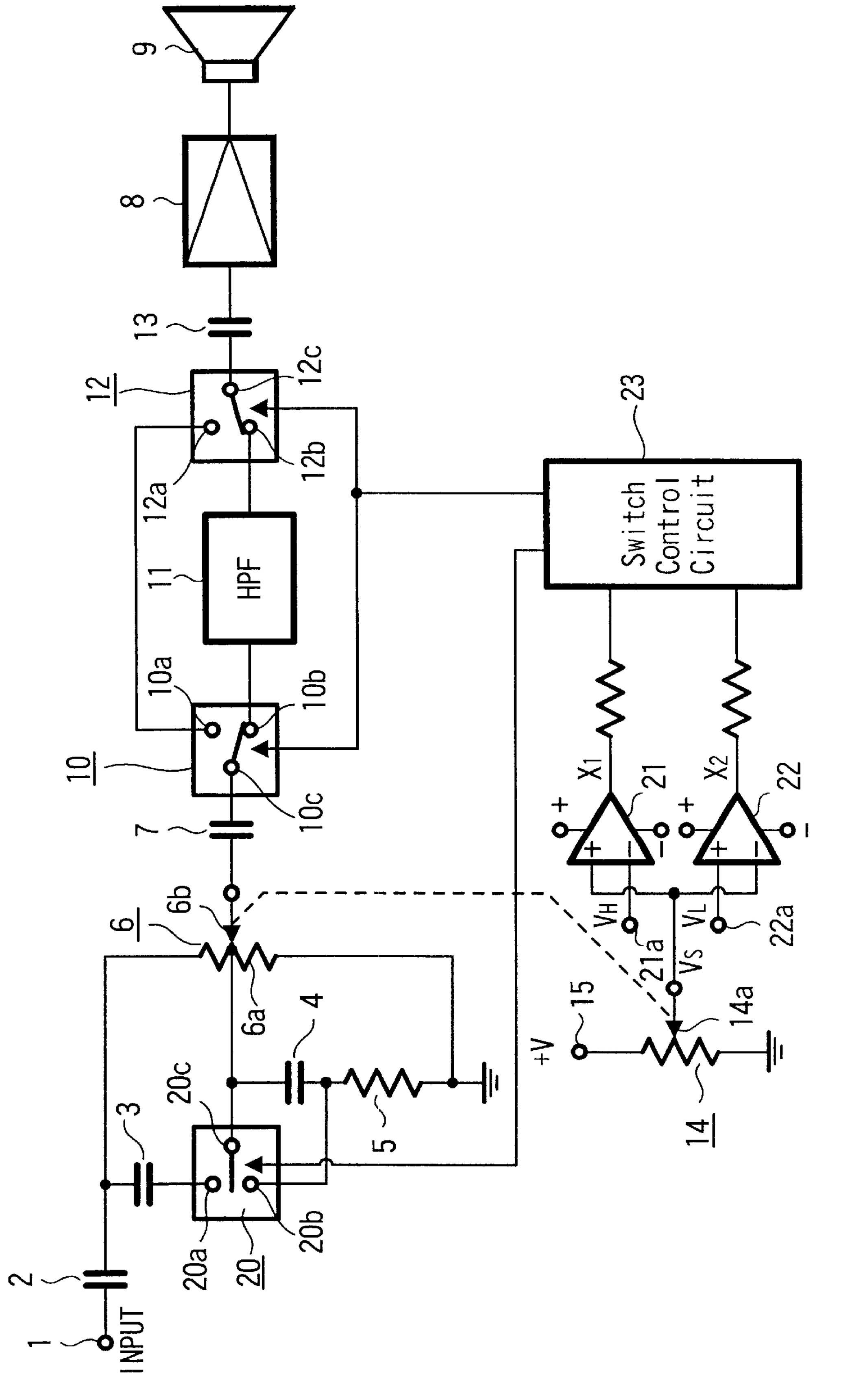
FIG. 3 is a block diagram showing another example of the embodiment of the speaker driving circuit of the invention.

FIG. 3 shows another example of the embodiment of the speaker driving circuit of the invention. In FIG. 3, the same parts corresponding to those in FIG. 1 are identified with same reference numerals, and detailed description is omitted. In this example in FIG. 3, unlike the example in FIG. 1, the ultralow range is not emphasized when the level of an audio signal is extremely low.

In FIG. 3, an audio signal input terminal 1 is connected to a one end of a coupling capacitor 2, the other end of this coupling capacitor 2 is connected to a fixed contact point 20*a* of a changeover switch 20 through a capacitor 3, a movable contact point 20*c* of this changeover switch 20 is grounded by way of a series circuit of a capacitor 4 and a resistor 5, a connection mid point of the capacitor 4 and resistor 5 is connected to the other fixed contact point 20*b* of the changeover switch 20, the connection mid point of the coupling capacitor 2 and capacitor 3 is grounded through a variable resistor 6, and the movable contact point 20*c* of this changeover switch 20 is connected to an intermediate point of a resistor element 6*a* of the variable resistor 6. The movable element 6*a* of the variable resistor 6 is connected to the movable contact point 10*c* of the changeover switch 10.

In this case, when the movable contact point 20*c* of the changeover switch 20 is connected to one fixed contact point 20*a*, the same as shown in FIG. 1, a loudness control circuit for emphasizing the ultralow range is inserted in the audio signal path, and the ultralow range is emphasized, and when the movable contact point 20*c* of this changeover switch 20 is connected to another fixed contact point 20*b*, the audio signal supplied to the audio signal input terminal 1 is supplied directly to the variable resistor 6, so that the ultralow range is not emphasized.

Also in the example shown in FIG. 3, a power source terminal for obtaining a positive DC voltage of +V is grounded through a level detecting variable resistor 14, and the movable element 14*a* of this level detecting variable resistor 14 is interlocked with the movable element 6*b* of the variable resistor 6 for audio level adjustment. In this case, at the movable element 14*a* of the level detecting variable resistor 14, a detection voltage level Vs depending on the level of the audio signal obtained at the movable element 6*b* of the variable resistor 6 for audio level adjustment is obtained.

In this example, the detection voltage level Vs depending on the audio signal level obtained at the movable element 14*a* of the level detecting variable resistor 14 is applied to a non-inverting input terminal + of an operational amplifier 21 and an inverting input terminal − of an operational amplifier 22 for composing a comparator.

Also in the example, by applying a voltage VH at a fixed voltage input terminal 21*a*, of which the level of an audio signal obtained by the movable element 6*b* of the variable resistor 6 is equal to a medium level, for example, the level supplied to the speaker 9 is equal to the detection voltage level Vs obtained at the movable element 14*a* of the level detecting variable resistor 14 corresponding to −30 dB, the voltage VH obtained at this fixed voltage input terminal 21*a* is applied to the inverting input terminal − of the operational amplifier 21.

Further in the example, by applying a voltage VL at a fixed voltage input terminal 22*a*, of which the level of an audio signal obtained at the movable element 6*b* of the variable resistor 6 is low, for example, the level supplied to the speaker 9 is equal to the detection voltage level Vs obtained at the movable element 14*a* of the level detecting variable resistor 14 corresponding to −55 dB, the voltage VL obtained at this fixed voltage input terminal 22*a* is supplied to the non-inverting input terminal + of the operational amplifier 22.

Therefore, at outputs $X_1$ and $X_2$ of the operational amplifiers 21 and 22, when the detection voltage level Vs obtained at the movable element 14*a* of the level detecting variable resistor 14 shown in Table 1 is 0 V to VL, output $X_1$ is low level "0" and output $X_2$ is high level "1", and when the detection voltage level Vs is VL to VH, output $X_1$ is low level "0" and output $X_2$ is low level "0", and further when the detection voltage level Vs is VH to +V, output $X_1$ is high level "1" and output $X_2$ is low level "0".

TABLE 1

| Vs | 0-VL-VH-+V |
|---|---|
| $X_1$ | "0" "0" "1" |
| $X_2$ | "1" "0" "0" |

In this example, the outputs $X_1$ and $X_2$ of the operational amplifiers 21 and 22 are supplied to a switch control circuit 23 through resistors. This switch control circuit 23 controls to change over the movable contact points 20*c*, 10*c*, and 12*c* of the changeover switches 20, 10 and 12 depending on the outputs $X_1$ and $X_2$ of the operational amplifiers 21 and 22.

That is, the movable contact point 20*c* of this changeover switch 20 is connected to the other fixed contact point 20*b* until the detection voltage level Vs obtained at the movable element 14*a* of the level detecting variable resistor 14 becomes the voltage VL, and when this detection voltage level Vs exceeds the voltage VL, the movable element 20*c* is connected to one fixed contact point 20*a*, and at this time the loudness control circuit is inserted in the audio signal path, and the ultralow range is emphasized.

The movable contact points 10*c* and 12*c* of the changeover switches 10 and 12 are connected to the fixed contact points 10*a* and 12*a* respectively until the detection voltage level Vs obtained at the movable element 14*a* of the level detecting variable resistor 14 reaches the voltage VH, and at this time the high-pass filter 11 is not inserted in the audio signal path.

When the detection voltage level Vs exceeds the voltage VH, the movable contact points 10*c* and 12*c* are connected to the other fixed contact points 10*b* and 12*b*, and the high-pass filter 11 is inserted in the audio signal path at this time, and the ultralow range is cut off. The example in FIG. 3 is the same as the configuration in FIG. 1 in all other respects.

Figure 4:
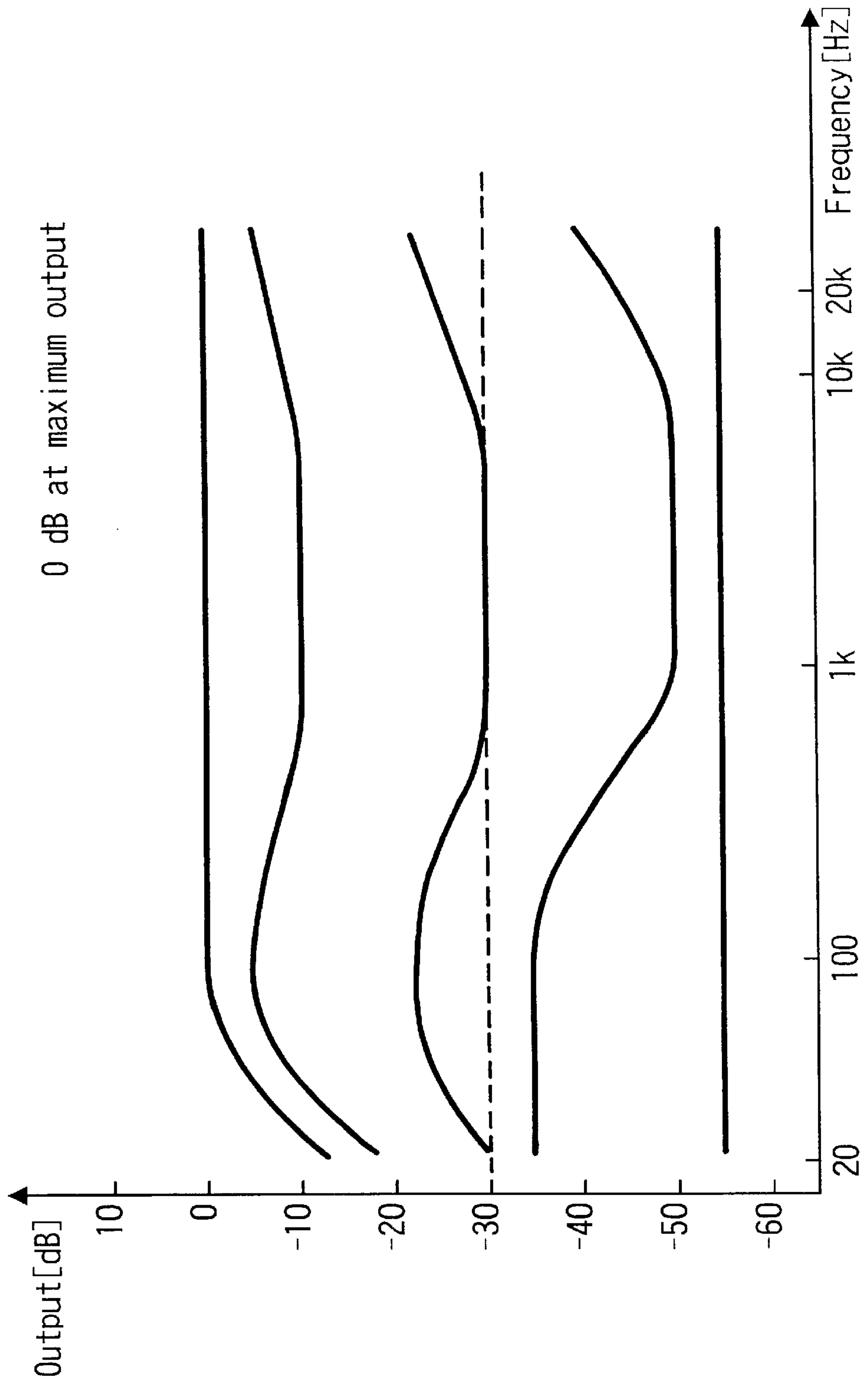
FIG. 4 is a diagram for explaining FIG. 3.
Figure 6:
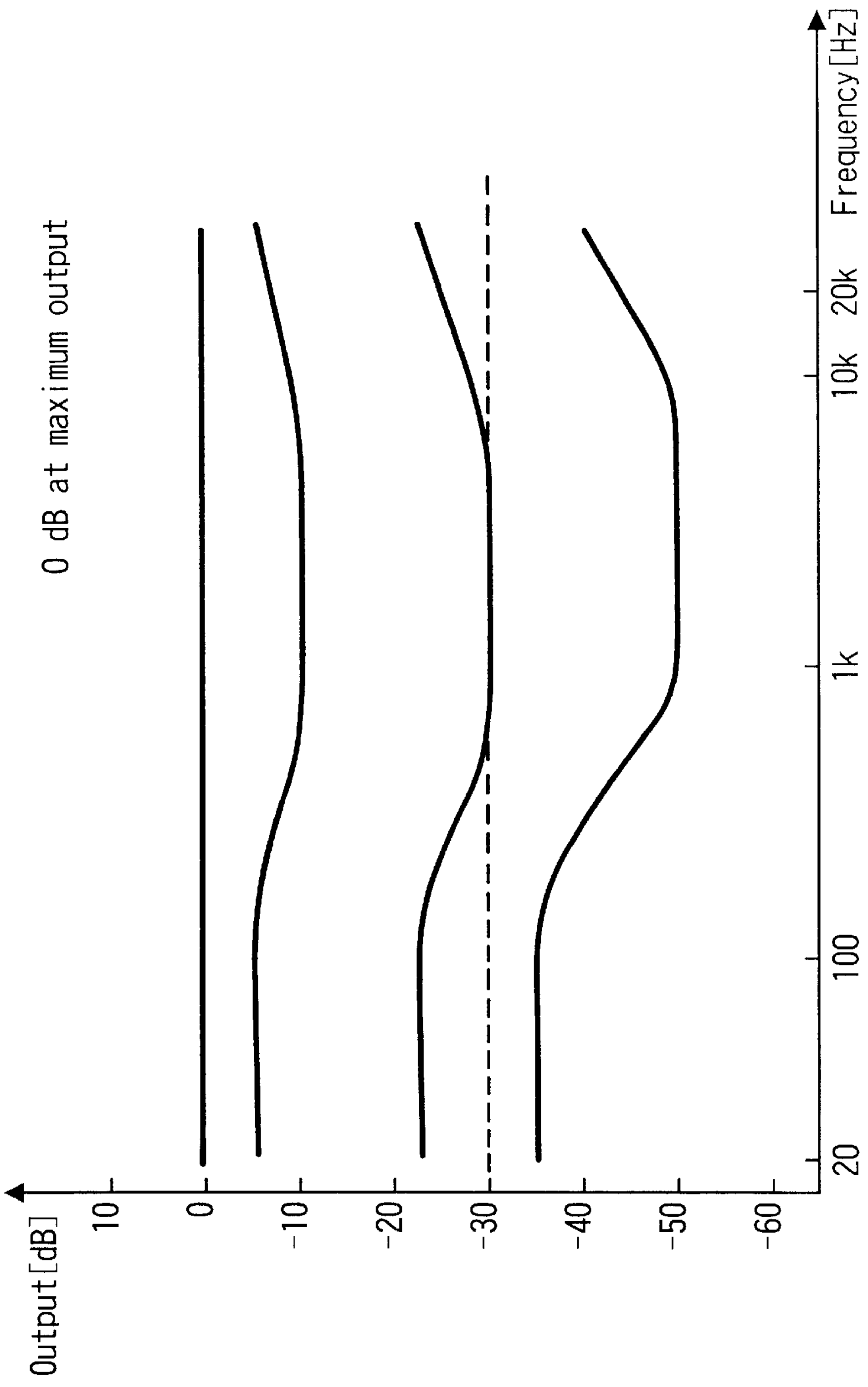
FIG. 6 is a diagram for explaining FIG. 5.

The example in FIG. 3 is thus composed, and the frequency characteristic of the audio signal supplied to the voice coil of the speaker 9 is as shown in FIG. 4, and it is a flat characteristic when the audio signal level is low, for example, below −55 dB, and hence noise is not emphasized. When this audio signal level is higher than this low level and lower than the medium level, for example, around −55 dB to −30 dB, the ultralow range is emphasized in this frequency characteristic, and the voice coil of the speaker 9 is driven by the audio signal extended in the frequency characteristic to the ultralow range, so that the bass of high quality is obtained without phase loss.

When the level of the audio signal supplied to the voice coil of the speaker 9 is higher than the medium level, for example, more than −30 dB, the frequency characteristic of the audio signal is as shown in FIG. 4, and the ultralow range is cut off by the high-pass filter 11, and clip or the like does not occur, and the diaphragm of the speaker 9 is not oscillated in the ultralow range, so that no adverse effect is caused on the sound quality.

Therefore, it is easily understood that the same action and effect as in the example in FIG. 1 are obtained also in the example in FIG. 3.

The foregoing examples are analog compositions, a digital composition may be also formed by using DSP (digital signal processor) and others.

The invention is not limited to the illustrated examples alone, but may be changed and modified within the scope of the invention.

As explained above, according to the present invention, when the audio signal is below the medium level, for example, below −30 dB (a containing ordinary audio level in a television receiver), the ultralow range is emphasized, and the voice coil of the speaker is driven by an audio signal extended in the frequency characteristic to the ultralow range, and therefore the bass of high quality is obtained without phase loss, and when the audio signal is above the medium level, for example, above −30 dB, the ultralow range is cut off by the high-pass filter, and hence clip or the like does not occur, and moreover since the diaphragm of the speaker is not oscillated in the ultralow range, there is no adverse effect on the sound quality.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A loudspeaker driving circuit comprising:

volume adjusting means for adjusting an output level of an audio signal supplied to a loudspeaker of a television receiver;

a loudness control circuit having variable frequency characteristics corresponding to an adjusted state of said volume adjusting means for emphasizing a signal level of low-frequency components of the audio signal adjusted in level by the volume adjusting means;

a level detecting variable resistor operating in conjunction with the volume adjusting means and producing an output representing an adjusted state of said volume adjusting means;

a high-pass filter for reducing low-frequency components of the audio signal and being selectively inserted in a signal path of the audio signal following the loudness control circuit;

bypass switch means for bypassing the high-pass filter in the signal path of the audio signal;

a switching control circuit including a comparator responsive to the output of the level detecting variable resistor, wherein the switching control circuit controls the bypass switch means to bypass the high-pass filter when the output of the level detecting variable resistor is below a threshold level and controls the bypass switch means to insert the high-pass filter when the output of the level detecting variable resistor is above the threshold level; and a loudspeaker driver circuit for supplying the loudspeaker of the television receiver with the audio signal.

2. A loudspeaker driving circuit comprising:

volume adjusting means for adjusting an output level of an audio signal supplied to the loudspeaker of a television receiver;

a loudness control circuit having variable frequency characteristics corresponding to an adjusted state of said volume adjusting means for emphasizing a signal level of low-frequency components of the audio signal adjusted in level by the level adjusting means;

a level detecting variable resistor operating in conjunction with the volume adjusting means and producing an output representing an adjusted state of said volume adjusting means;

a high-pass filter for reducing low-frequency components of the audio signal and being selectively inserted in a signal path of the audio signal following the loudness control circuit;

bypass switch means for bypassing the high-pass filter in the signal path of the audio signal changeover switch means for changing over the input audio signal so that the loudness control circuit is not in the signal path of the audio signal;

a switching control circuit including a pair of comparators having respective first and second threshold levels fed thereto for comparing the output of the level detecting variable resistor, wherein the switching control circuit controls the changeover switch to changeover the input audio signal so that the loudness control circuit is not in the signal path when the output of level detecting variable resistor is below the first threshold level, wherein the switching control circuit controls the bypass switch means to bypass the high-pass filter when the output of the level detecting variable resistor is between the first and second threshold levels, and wherein the switching control circuit controls the bypass switch means to insert the high-pass filter in the signal path of the audio signal when the output of the level detecting variable resistor is above the second threshold level; and a loudspeaker driver circuit for supplying the loudspeaker of the television receiver with the audio signal.

* * * * *